United States Patent
Chang et al.

(10) Patent No.: US 8,285,772 B2
(45) Date of Patent: Oct. 9, 2012

(54) ORDER ADAPTIVE FINITE IMPULSE RESPONSE FILTER AND OPERATING METHOD THEREOF

(75) Inventors: Rong-Jen Chang, Taipei County (TW); Chi-Shun Weng, Hsinchu County (TW); Ming-Je Li, Hsinchu County (TW); Meng-Han Hsieh, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 920 days.

(21) Appl. No.: 12/322,503

(22) Filed: Feb. 3, 2009

(65) Prior Publication Data
US 2009/0198754 A1 Aug. 6, 2009

Related U.S. Application Data

(60) Provisional application No. 61/026,099, filed on Feb. 4, 2008.

(30) Foreign Application Priority Data

Sep. 12, 2008 (TW) .............................. 97135008 A

(51) Int. Cl.
*G06F 17/10* (2006.01)
(52) U.S. Cl. ......... 708/319; 708/316; 708/322; 455/450
(58) Field of Classification Search .............. 708/316, 708/319, 322; 455/450
See application file for complete search history.

(56) References Cited

U.S. PATENT DOCUMENTS

| | | | |
|---|---|---|---|
| 4,785,411 A | 11/1988 | Thompson et al. | |
| 5,159,565 A * | 10/1992 | Bune | 708/319 |
| 5,648,987 A * | 7/1997 | Yang et al. | 375/232 |
| 7,155,231 B2 * | 12/2006 | Burke et al. | 455/450 |
| 7,167,883 B2 * | 1/2007 | Greiss et al. | 708/319 |
| 7,196,997 B2 * | 3/2007 | Stek et al. | 369/59.16 |
| 7,366,231 B2 * | 4/2008 | Tellado et al. | 375/219 |
| 7,804,922 B2 * | 9/2010 | Shi et al. | 375/350 |
| 8,005,176 B2 * | 8/2011 | Song | 375/350 |
| 8,139,760 B2 * | 3/2012 | Dyba et al. | 379/406.14 |
| 2010/0061738 A1 * | 3/2010 | Giorgi et al. | 398/149 |

* cited by examiner

*Primary Examiner* — Tammara Peyton
(74) *Attorney, Agent, or Firm* — Thomas, Kayden, Horstemeyer & Risley, LLP

(57) ABSTRACT

A device for allocating a number of taps of a designated finite impulse response filter is disclosed. The device comprises a plurality of designated finite impulse response filters having fixed number of taps, a plurality of allocation finite impulse response filters having fixed number of taps, a control unit and an estimate unit. Depending on intensities of responses to interferences, at least one of the allocation FIR filters may be coupled in series to any one of the designated finite impulse response filters, thereby to provide a signal having excellent quality.

22 Claims, 4 Drawing Sheets

ORDER ADAPTIVE FINITE IMPULSE RESPONSE FILTER AND OPERATING METHOD THEREOF

CROSS REFERENCE TO RELATED APPLICATIONS

This application claims the benefit of U.S. Provisional Application No. 61/026,099 and Taiwan Application No. 97135008, which were filed on Feb. 4, 2008 and Sep. 12, 2008 respectively.

BACKGROUND

1. Field of the Invention

The present invention relates to a device and method for sharing a filter resource, and in particular, to a device and a method for adaptively allocating a number of taps of at least a digital filter based on one or more parameters related to a tap amount.

2. Description of Related Art

A digital filter includes an adder, a multiplexer and/or a delay element, which are different from those of an analog filter such as resistor, capacitor, inductor, etc. Because the adder, the multiplexer and the delay element are insensitive to the temperature, the digital filter is stable against the temperature. Therefore, if parameters of the digital filter are determined appropriately, the digital filter can achieve the desired accuracy and stability.

In general, there are two types of digital filters, one of which is a finite impulse response (hereafter, FIR) filter and the other one is an infinite impulse response (hereafter, IFIR) filter. Taking Nth order FIR filter for example, a relation between an input signal and an output signal can be expressed by the following equation (1) and transfer function (2):

$$y[n] = \Sigma_{i=0}^{N} b_i x[n-i] \quad (1)$$

$$H[z] = \Sigma_{n=0}^{N} b_n z^{-n} \quad (2),$$

where $x[n-i]$ denotes the input signal, $y[n]$ denotes the output signal, N is called as the order (generally corresponding to N+1 taps) or the length of the filter, and $b_i$ is a coefficient of the filter. $H[z]$ is the function of Z-transform of $y[n]$.

It is well known in this field that the exemplified Nth order FIR filter can be expressed by the block diagram of FIG. 1.

Generally, the higher the order of the FIR filter is, the better the filtering performance is but the higher the cost is.

FIG. 2 is a block diagram showing the configuration of an adaptive FIR filter. It is known that the adaptive filter can self-adjust the coefficients of the filter by a feedback mechanism. As shown in FIG. 2, a correction processor 202 may adjust the coefficients of the FIR filter so as to optimize an output signal û(n), based on a feedback error between the output signal û(n) of an FIR filter 201 and a desired signal u(n) and an input signal x(n)=(u(n)+i(n)) of the FIR filter, wherein i(n) is an interference noise. Therefore, the adaptive FIR filter is usually used for processing a signal with interferences unpredictable in advance.

The finite FIR filters are widely used in many applications. For example, in an application of an Ethernet connection, the FIR filters are used to cancel various interferences. In a case that a plurality of sets of unshielded twisted pairs are used as multi-channel media for the Ethernet connection, when a signal is transmitted in a first channel among the channels, the signal may cause an echo interference to the first channel and cause a near-end cross talk (NEXT) interference to the channels neighboring to the first channel, and the first channel may also be interfered by the NEXT interference from its neighboring channels. In such a case, the FIR filters are used to cancel these interferences and other noise, respectively. Generally, the order (corresponding to number of taps) of a FIR filter is fixed and determined by its application. Therefore, when a same FIR filter is used in various applications, the signal may not be filtered well due to varying factors such as quality of wires, length of the wires or communication environment. In other words, a FIR filter having a fixed and deficient order may not adaptively filter the interferences as the environment gets worse, or a filter designed to have a large order for handling the worst situation may bring a waste. For example, if a first designated FIR filter of M taps is used to cancel the echo interference and a second designated FIR filter of M taps is used to cancel the NEXT interference in a situation that the echo interference is minor and the NEXT interference is severe, the first designated FIR filter only needs a number of taps less than M taps to filter out the echo interference while the second filter needs a number of taps more than M taps to filter out the NEXT interference. This will result in the resource waste in filtering the echo interference and the resource shortage in filtering the NEXT interference.

Therefore, to achieve a better filtering performance under the situation that the filtering resource is constant, a device and a method are required to be able to adaptively allocate filter resources.

SUMMARY OF THE INVENTION

In view of the above, the present invention provides a device and a method for adaptively allocating resources of FIR filters based on one or more parameters associated with a number of taps.

According to one aspect of this invention, a FIR filtering device comprises: a first designated FIR filter having a first fixed number of taps and being adapted to filter a first signal; a second designated FIR filter having a second fixed number of taps and being adapted to filter a second signal different from the first signal; a switching circuit being coupled to the first and the second designated FIR filters, respectively; an allocation FIR filter having a third fixed number of taps; an estimation circuit for estimating effects of filtering the first signal and of filtering the second signal according to one or more parameters so as to generate one or more estimation results; and a control circuit, in response to the one or more estimation results, for coupling M tap/taps of the allocation FIR filter to the first designated FIR filter through controlling the switching circuit, and coupling N tap/taps of the allocation FIR filter to the second designated FIR filter through controlling the switching circuit, where M and N are integers equal to or greater than zero.

According to another aspect of this invention, the FIR filtering device applies to but not limited to an Ethernet communication device such as a network interface card, a network switch, a network hub, a network router, a network gateway, a server, or a data center.

The objects, technical contents, features, and effects of the present invention will be more readily apparent from the following description of the embodiments with reference to the accompanying drawings.

BRIEF DESCRIPTION OF THE DRAWINGS

In the accompanying drawings.

DESCRIPTION OF THE PREFERRED EMBODIMENTS

The present invention provides a device and a method for adaptively allocating a filtering resource of a finite impulse response (FIR) filtering device. According to the embodiments of the present invention, designated FIR filters are provided for canceling specific interferences and allocation FIR filters are provided for adaptive allocation, and a combination of the designated and allocation FIR filters capable of reaching an optimal filter performance according to examining various signal qualities of various combinations of the designated and allocation FIR filters.

Figure 1:
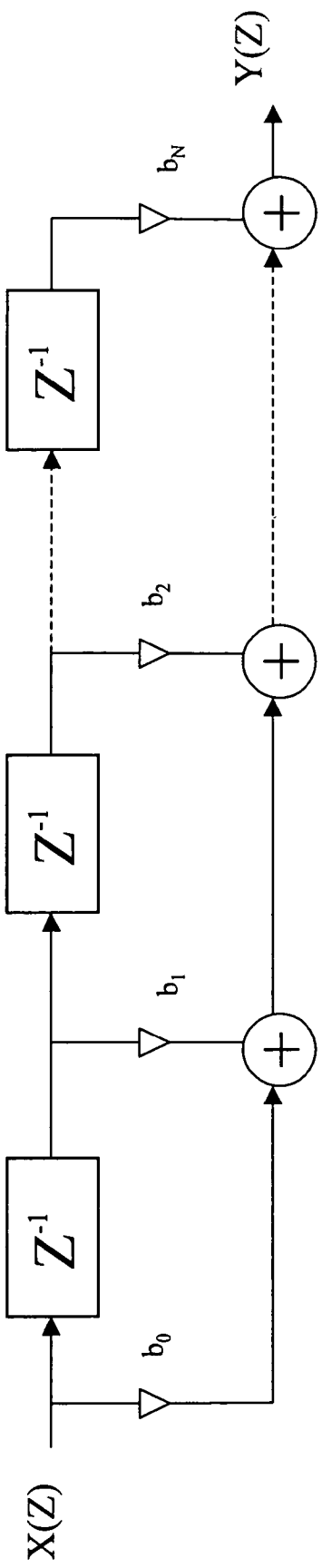
FIG. 1 is a block diagram showing an example of an Nth order FIR filter.
Figure 2:
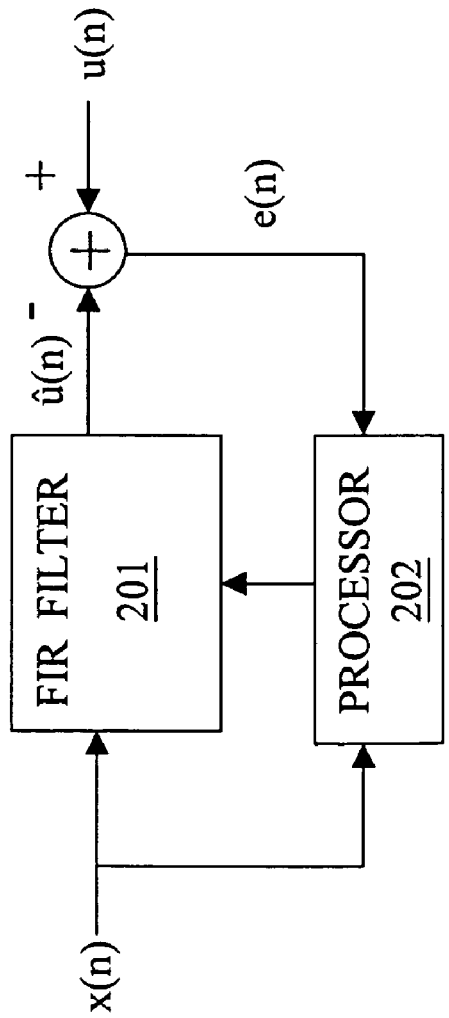
FIG. 2 is a block diagram showing an example of an conventional structure of an adaptive FIR filter.
Figure 3:
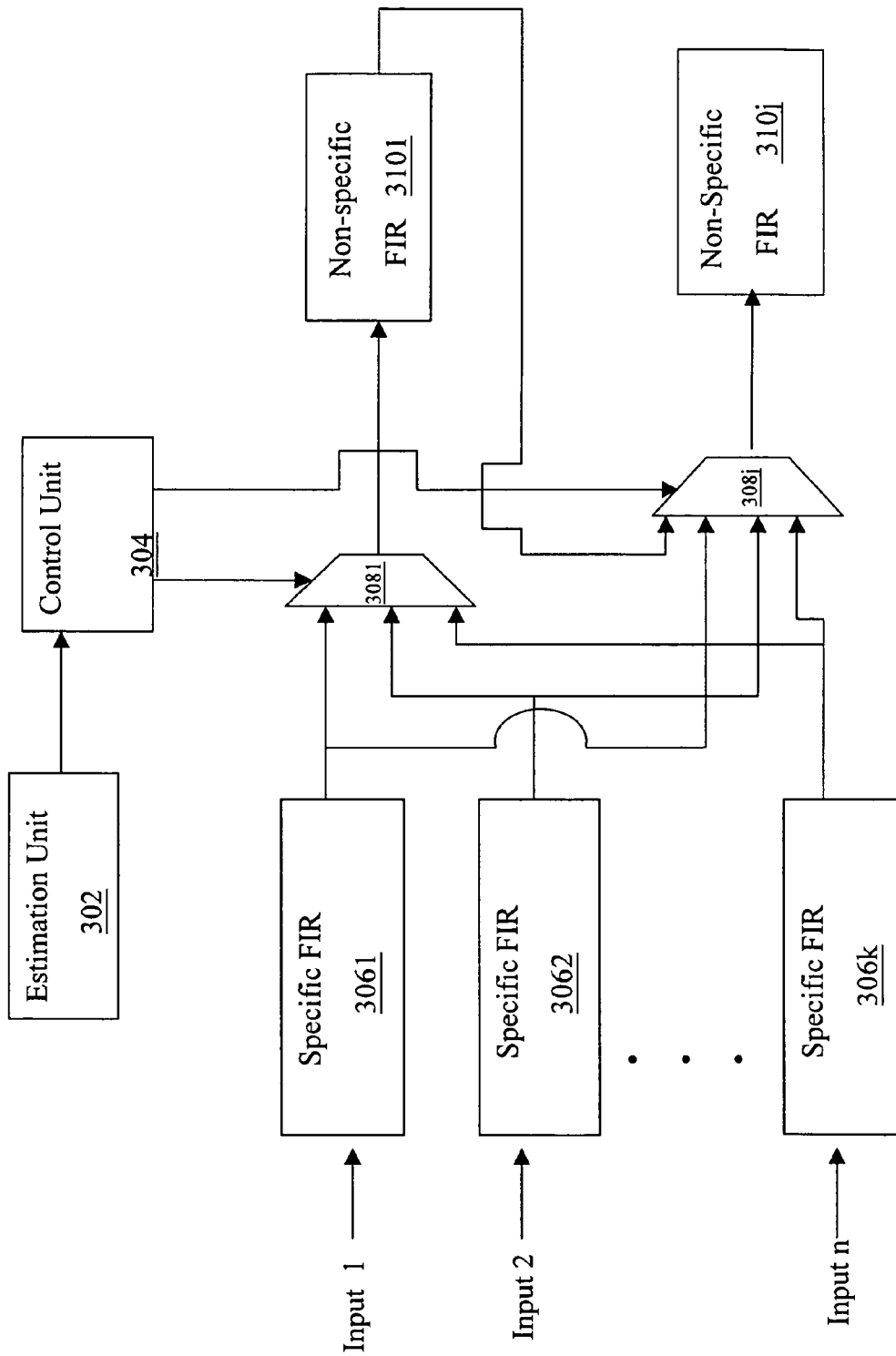
FIG. 3 shows a device for adaptively allocating a number of taps of a FIR filter according to an embodiment of the present invention.

FIG. 3 is a block diagram showing a device 300 for allocating a filter resource according to the present invention. As shown in FIG. 3, the device 300 includes an estimation unit 302, a control unit 304, k designated FIR filters 3061 to 306k, j switching circuits (for example, multiplexers) 3081 to 308j and j allocation FIR filters 3101 to 310j. The designated FIR filters 3061 to 306k generate compensations corresponding to various interference, based on signals input thereto, respectively. Allocation FIR filters 3101 to 310j are adaptively coupled to the designated FIR filters so as to increase the filter performance of the designated FIR filters. The control unit 304 determines how to combine a designated FIR filter with one or more of the allocation FIR filters. The estimation unit 302 finds out an optimal combination of a designated FIR filter and at least an allocation FIR filter among a plurality of different combinations, which can excellently cancel interference.

In general, a signal may be subjected to various specific interferences when it is transmitted or processed in different environments. These specific interferences have features distinguishable from each other. Some of these specific interferences need to be cancelled when they have significant influence on the signal quality. Therefore, depending on various applications, the device 300 is provided with designated FIR filters 3061 to 306k, each of which has a fixed number of taps, to generate responses for canceling certain specific interferences in the received signal. The designated FIR filters 3061 to 306k can be used to cancel at least one kind of various specific interferences depending on applications. For example, FIR filters 3061 and 3062 may be used for canceling interference A, and the other designated FIR filters 306k may be used for canceling interference B, in which FIR filters 3061, 3062 and 306k all have fixed numbers of taps which may be the same or different from each other depending on applications. Alternatively, each of the FIR filters 3061 to 306k is designated for one specific interference and has a fixed number of taps.

In the device 300, the allocation FIR filters 3101 to 310j have fixed numbers of taps which may be the same or different from each other depending on the design requirements. When a designated FIR filter dedicated to the specific interferences has a number of taps insufficient to cancel the specific interference, at lease one of the allocation FIR filters 3101 to 310j will be coupled to the designated FIR filters, in order to help cancel the specific interference.

Subsequently, an example that the device 300 is applied to an Ethernet is given to further explain the operation of the device 300.

Regarding Ethernet connection, a plurality of unshielded twisted pairs are used as media of multiple channels (e.g., channels A, B, C, and D), a signal received in one of the channels is subject to an echo interference caused by a transmitted signal reflection in the same channel, and the received signal is also subject to a near-end cross talk (NEXT) interference caused by signals of the neighboring channels. In other words, a signal transmitted from one end of one channel is an interference source in this channel itself, and is another interference source in its neighboring channels. It is well known that the echo and the NEXT interferences are major interferences in Ethernet connection.

In this embodiment, the device 300 is applied to the channel A among the four channels (channels A, B, C, and D), the number of the designated FIR filters is 4 (k=4), which are the echo cancellation FIR filter 3061 and the NEXT cancellation FIR filters 3062, 3063, and 3064, and the number of the allocation FIR filters is 2 (j=2), which are FIR filters 3101 and 3102. The echo cancellation FIR filter 3061 is used for canceling the echo interference caused by the signal transmitted through the channel A, and its number of taps is predetermined to be $L_{echo}$, and the NEXT cancellation FIR filters 3062, 3063, and 3064 are used for canceling the NEXT interferences caused by signals of the neighboring channels B, C, and D, and their number of taps are predetermined to $L_{NEXT}$. The number of taps of the two allocation FIR filters FIR 3101 and 3102 are $L_{NEC}$ and $L_{NED}$, respectively. As known, since the echo interference is much greater than the NEXT interference, preferably, the number of taps of the echo cancellation FIR filter is set to be larger than that of the NEXT cancellation FIR filter, i.e., $L_{echo}$ larger than $L_{NEXT}$. In addition, each of the designated and allocation FIR filters used here is an adaptive FIR filter type.

Figure 4:
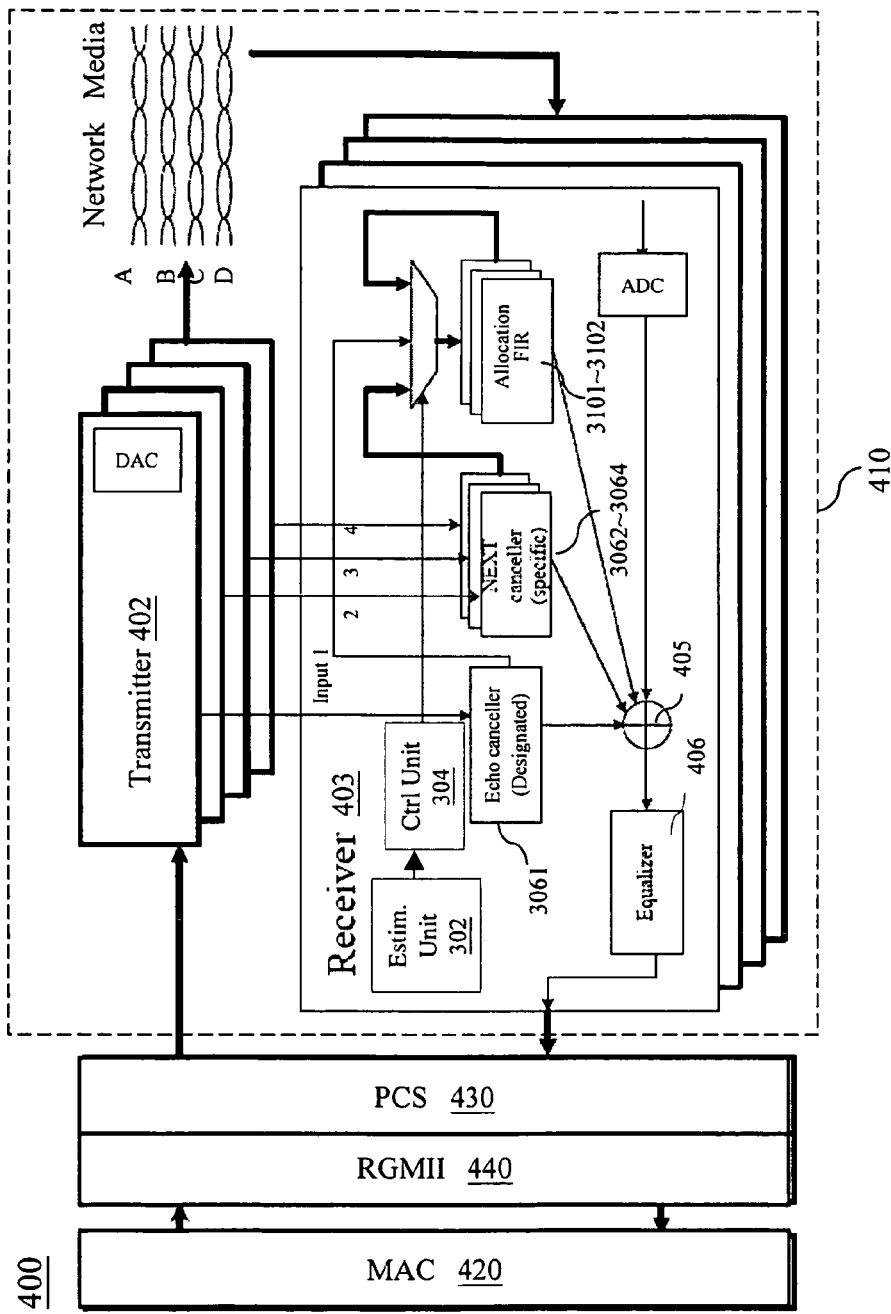
FIG. 4 shows an embodiment of a communication device having the device for adaptively allocating a number of taps of a FIR filter.

FIG. 4 shows an embodiment of a communication apparatus 400 having the device 300. As shown in FIG. 4, the communication apparatus 400 includes a medium access control circuit (MAC) 420, a physical coding sub-layer circuit (PCS) 430, a reduction gigabit media independent interface (RGMII) 440 and a physical layer circuit (PHY) 410. The PHY 410 includes a transmitter 402 and a receiver 403. The device 300 according to the present invention is installed in the receiver 403. The receiver 403 further includes an adder 405, and an equalizer 406. Please note that the implementation of the above-mentioned MAC 420, PCS 430, RGMII 440, PHY 410, transmitter 402, adder 405 and equalizer 403 is known in this field and thereby unnecessary description thereof is omitted.

When the device 300 is provided in the communication apparatus 400, and the communication apparatus 400 is coupled to a remote communication device R (not shown) through the channels A, B, C and D, a training operation is performed to make sure the device 300 adaptive to its surroundings. In such a training operation, an optimal combination of a designated FIR filter and one or more allocation FIR filters can be determined. Besides, the communication apparatus 400 and the communication device R may be a network interface card of a personal computer, a network switch, a hub, a router, a gateway, a data center, or the like. Also, a person of ordinary skill in the art will appreciate a modification to the communication apparatus 400 in accordance with a prior application.

During the training operation, the communication apparatus 400 may transmit a signal SA through the channel A, and at the same time the remote communication device R transmits an original signal $S_0$ to the communication apparatus 400 through the channel A. The signal SR received by the communication apparatus 400 therefore includes the original signal $S_0$ (which may be distorted during transmission), an echo interference $S_{echoA}$ caused by the signal SA, a NEXT interference $S_{nextB}$ caused by a signal SB transmitted by the channel B, a NEXT interference $S_{nextC}$ caused by a signal SC transmitted by the channel C, a NEXT interference $S_{nextD}$ caused by a signal SD transmitted by the channel D and other noise $S_{noise}$. In other words, SR can be expressed by the following equation:

$$SR = S_0 + S_{echoA} + S_{nextB} + S_{nextC} + S_{nextD} + S_{noise}$$

Here, we assume that the noise $S_{noise}$ is not significant and thereby exclude it from the following consideration.

Accordingly, if these interferences $S_{echoA} + S_{nextB} + S_{nextC} + S_{nextD}$ are eliminated from the signal SR as completely as possible, a signal very close to the original signal $S_0$ can be obtained. The device 300 therefore plays a role to adaptively reduce the noises $S_{echoA}$, $S_{nextB}$, $S_{nextC}$ and $S_{nextD}$ in accordance with their respective influences. Please note that since the coefficients of an adaptive FIR filter corresponds to its impulse response, they are used to represent the signal quality hereinafter.

According to this embodiment, the sum of the squares of the absolute values of respective coefficients of the allocation FIR filters coupled to a designated FIR filter are used to estimate the signal quality of such coupled filters, and an optimal combination of the FIR filters can be determined by estimating various signal qualities corresponding to various combinations and thereby finding out a combination providing the best signal quality or providing a signal quality above a predetermined quality threshold to be the optimal combination. In an embodiment, all possible combinations are examined to determine the optimal combination of the best signal quality. In another embodiment, when a plurality of combinations are found to be qualified with respect to the quality threshold, the combination whose signal quality most close to the quality threshold is chosen to avoid wasting the filtering resource. In another embodiment, once a first qualified combination is found, the estimation procedure will be finished. Please, note that other indexes such as the sum of absolute values of respective coefficients, the signal-to-noise ratio (SNR), and the bit-error-rate (BER) could be used for estimating the signal quality. Those having the ordinary knowledge in this field appreciate how to use an appropriate parameter and algorithm to obtain an index associated with the signal quality.

Now, referring to FIG. 3 again, an example of estimation operation for deciding the response intensity is explained.

When the device 300 provided in the communication apparatus 400 is used for channel A, the input terminal of the echo cancellation FIR filter 3061 receives the signal SA (input 1) transmitted from the communication 400, the input terminals of the NEXT cancellation FIR filters 3062, 3063, and 3064 receive the signals SB (input 2), SC (input 3), and SD (input 4) from the channels B, C, and D, respectively.

Under the above-mentioned configuration, the estimation unit 302 first determines whether the echo cancellation and NEXT cancellation FIR filters are sufficient to provide an acceptable signal quality, by comparing at least a quality threshold with the current signal quality (e.g., a current impulse response, SNR, BER, etc.). If the current signal quality doesn't reach the quality threshold, a test for determining an optimal filter combination proceeds. During the test, the estimation unit 302 first generates one or more estimation results to indicate whether the number of taps $L_{echo}$ of the FIR filter 3061 is sufficient to cancel the response of the echo interference, by comparing at least a first threshold with the impulse response caused when the echo cancellation FIR filter 3061 receives the signal SA, the impulse response here being a sum of squares of the absolute values of the respective current coefficients of the echo cancellation FIR filter 3061. Thereafter, if the impulse response doesn't reach the first threshold, the control unit 304, in response to the one or more estimation results, controls the switching circuit 3081 to couple the allocation FIR filter 3101 to the echo cancellation FIR filter 3061 in series, so as to organize a new filter combination. Under this new combination, the estimation unit 302 generates one or more estimation results by comparing at least a second threshold with a signal quality index such as a sum of squares of the respective current coefficients of the FIR filter 3101. For example, if the number of taps of the FIR filter 3101 is $L_{NEC}$, and its respective coefficients are $b_1[0], \ldots, b_1[L_{NEC}-1]$, the estimation result is generated by comparing the second threshold with the signal quality index $|b_1[0]|^2 + \ldots + |b_1[L_{NEC}-1]|^2$. Thereupon the control unit 304 again organizes another combination and so on and so forth until the optimal combination for the echo cancellation is determined.

In an embodiment, if the allocation FIR filter 3101 is not enough to obtain the optimal combination for the echo cancellation, the estimation unit 302 and the control unit 304 will then organize more combinations by utilizing the allocation FIR filters 3102, 3103, ..., 301j till the optimal combination is found. In another embodiment, the estimation unit 302 determines the optimal combination for the echo cancellation according to the maximum signal quality index among the signal quality indexes associated with all possible filter combinations, and accordingly makes the control unit 304 to select or maintain the optimal combination.

Briefly, in response to the one or more estimation results of the estimation unit 302, the control unit 304 organizes a plurality of combinations by progressively increasing or decreasing the number of taps of the allocation FIR filter(s) coupled to the echo cancellation FIR filter 3061, so as to find out the optimal combination among the plurality of combinations.

Besides, if the estimation unit 302 decides that the current filter configuration of the device 300 is not sufficient to provide an acceptable signal quality according to a signal quality index and at least a predetermined quality threshold, and decides that the echo cancellation FIR filter 3061 is sufficient to cancel the echo interference, an operation similar to the fore-mentioned process of finding out the optimal combination for echo cancellation will be performed for determine the optimal combination for NEXT cancellation. And if both of the echo and NEXT cancellations need to be improved but the optimal combinations for the echo and NEXT cancellation can't be realized at the same time, the estimation unit 302 and control unit 304 may utilize the allocation FIR filters 3101 to 310j to equally improve the echo and NEXT cancellations or to improve the echo and NEXT cancellations in accordance with a predetermined rule.

In the above description, each of the channels has a transceiver including the designated FIR and allocation FIR filters, the estimation unit, the control unit, etc. However, each transceiver may have its own designated and allocation FIR filters but share the same estimation unit, the control unit, etc. Alternatively, the designated FIR and/or allocation FIR filters in transceiver may be used to improve filter performance of another transceiver. Therefore, according to this invention, the designated and the allocation FIR filters, and the units such as the estimation unit and the control unit may be allocated in a best manner depending on requirements, which means the way to allocate the allocation FIR filters could be very flexible. Those who have ordinary skill in the art will appreciate the above-mentioned embodiments are not limits to the present invention, but the examples to help realize the present invention In the above description, although the Ethernet is taken as an example for explaining this invention, i.e., this invention may be applied to the network switch, the network hub, the network router, the network gateway, etc., this invention is not limited to the application of the Ethernet. For example, this invention may be applied to the wireless communication device. In addition, although an example for canceling various interferences is taken for explaining this invention, this invention is not limited to this but may be applied to the adaptive adjustment of a multi-channel communication device. For example, in a communication device provided with FIR filters form channels, when only k channels among m channels are used but the other (m-k) channels are spared, the FIR filters for the (m-k) channels may be used for the k channels to improve the processing quality of the signal. Any application requiring the allocation of the FIR filter resources falls within the scope of this invention.

Further, this invention can be applied to at least one of the following situations:

(1) In a single communication device such as the above network switch, the network hub, the network router, the network gateway, or the wireless communication device, one transceiver is provided with a plurality of designated FIR filters, each of which has a fixed number of taps. One of the plurality of FIR filters is adaptively coupled in series to another allocation FIR filter inside or outside the transceiver, so as to increase its number of taps.

(2) In a single communication device, each of a plurality of transceivers is provided with at lease one designated FIR filter having a fixed number of taps. One of the FIR filters is adaptively coupled in series to another allocation FIR filter inside or outside the plurality of transceivers, so as to increase its number of taps.

(3) In a plurality of communication devices, each of transceivers respectively belonging to the plurality of communication devices is provided with at least one designated FIR filter having a fixed number of taps. One of the FIR filters is adaptively coupled in series to another allocation FIR filter inside or outside its corresponding transceiver, so as to increase its number of taps.

The above three situations, an allocation FIR filter and a designated FIR filters, which is intended to increase its number of taps by way of the coupling operation, may be provided in the same transceiver, different transceivers, or other portions not inside the transceiver.

This invention can adaptively adjust the number of taps of the FIR filters depending on application environments, and solve the problems of the prior art that the number of taps of the FIR filters are fixed in advance and can not be changed depending on the variation of the environment and the status of the interference. Therefore, this invention has the advantage that an excellent signal quality can be obtained in a limited cost. This invention can determine the parameters associated with the number of taps of the filters based on interference intensity or transition bandwidth, thereby to optimize the signal quality. For example, according to this invention, when the signal bandwidth of the signal processed by certain FIR filter is broader, more number of taps of the allocation FIR filters may be allocated to the designated FIR filter.

According to this invention, the device for allocating the number of taps of FIR filter can cancel responses to various interferences in a channel to ensure the transmission quality in a limited circuit cost and power resource.

While the present invention has been explained with reference to preferred embodiments, the present invention is not limited to specific details disclosed above. Various changes, modifications, alternatives, etc. may be made by those skilled in this art without departing the spirits of the present invention and should be interpreted to fall within the scope defined by the appended claims and their equivalents.

What is claimed is:

1. A finite impulse response (FIR) filtering device, comprising:
    a first designated FIR filter having a first fixed number of taps and being adapted to filter a first signal;
    a second designated FIR filter having a second fixed number of taps and being adapted to filter a second signal different from the first signal;
    a switching circuit being coupled to the first and the second designated FIR filters, respectively;
    an allocation FIR filter having a third fixed number of taps;
    an estimation circuit for estimating effects of filtering the first and second signals according to one or more parameters related to a number of taps, so as to generate one or more estimation results; and
    a control circuit, in response to the one or more estimation results, for coupling M tap/taps of the allocation FIR filter to the first designated FIR filter through controlling the switching circuit, and coupling N tap/taps of the allocation FIR filter to the second designated FIR filter through controlling the switching circuit, where M and N are integers equal to or greater than zero.

2. The device as claimed in claim 1, wherein the sum of said M and said N is equal to the third fixed number.

3. The device as claimed in claim 1, wherein the sum of said M and the first fixed number is different from the sum of said N and the second fixed number.

4. The device as claimed in claim 1, wherein the control circuit progressively increases or decreases a number of the taps of the allocation FIR filter coupled to the first designated FIR filter through controlling the switching circuit, and thereby the estimation circuit estimates the effect of filtering the first signal according to the one or more parameters as the coupling relation between the allocation FIR circuit and the first designated FIR filter varies, and accordingly generates part or all of the one or more estimation results.

5. The device as claimed in claim 4, wherein the control circuit progressively increases or decreases a number of the taps of the allocation FIR filter coupled to the second designated FIR filter through controlling the switching circuit, and thereby the estimation circuit estimates the effect of filtering the second signal according to the one or more parameters as the coupling relation between the allocation FIR circuit and the second designated FIR filter varies, and accordingly generates part or all of the one or more estimation results.

6. The device as claimed in claim 1, wherein the one or more parameters is one or a combination of a signal-to-noise ratio, at least one coefficient of the first designated FIR filter, at least one coefficient of the second designated FIR filter and a bit error rate.

7. An Ethernet communication device having a function of allocating finite impulse response (FIR) filtering resources, the device comprising a transceiver, the transceiver including:
    a first designated FIR filter having a first fixed number of taps and being adapted to filter a first signal;
    a second designated FIR filter having a second fixed number of taps and being adapted to filter a second signal different from the first signal;

a switching circuit being coupled to the first and the second designated FIR filters, respectively;

an allocation FIR filter having a third fixed number of taps;

an estimation circuit for estimating effects of filtering the first and second signals according to one or more parameters related to a number of taps so as to generate one or more estimation results; and a control circuit, in response to the one or more estimation results, for coupling M tap/taps of the allocation FIR filter to the first designated FIR filter through controlling the switching circuit, and coupling N tap/taps of the allocation FIR filter to the second designated FIR filter through controlling the switching circuit, where M and N are integers equal to or greater than zero.

8. The device as claimed in claim 7, wherein the sum of said M and said N is equal to the third fixed number.

9. The device as claimed in claim 7, wherein the sum of said M and the first fixed number is different from the sum of said N and the second fixed number.

10. The device as claimed in claim 7, wherein the control circuit progressively increases or decreases a number of taps of the allocation FIR filter coupled to the first designated FIR filter through controlling the switching circuit, and thereby the estimation circuit estimates the effect of filtering the first signal according to the one or more parameters as the coupling relation between the allocation FIR circuit and the first designated FIR filter varies, and accordingly generates part or all of the one or more estimation results.

11. The device as claimed in claim 10, wherein the control circuit progressively increases or decreases a number of taps of the allocation FIR filter coupled to the second designated FIR filter through controlling the switching circuit, and thereby the estimation circuit estimates the effect of filtering the second signal according to the one or more parameters as the coupling relation between the allocation FIR circuit and the second designated FIR filter varies, and generates part or all of the one or more estimation results.

12. The device as claimed in claim 7, wherein the one or more parameters is one or a combination of a signal-to-noise ratio, at least one coefficient of the first designated FIR filter, at least one coefficient of the second designated FIR filter and a bit error rate.

13. An Ethernet communication device having a function of allocating finite impulse response (FIR) filtering resources, the device comprising:

a first transceiver including:

a first designated FIR filter having a first fixed number of taps and being adapted to filter a first signal;

a second transceiver including:

a second designated FIR filter having a second fixed number of taps and being adapted to filter a second signal different from the first signal;

a switching circuit being coupled to the first designated FIR filter of the first transceiver and the second designated FIR filter of the second transceiver, respectively;

an allocation FIR filter having a third fixed number of taps;

an estimation circuit for estimating effects of filtering the first and second signals according to one or more parameters related to a number of taps, so as to generate one or more estimation results; and a control circuit, in response to the one or more estimation results, for coupling M tap/taps of the allocation FIR filter to the first designated FIR filter through controlling the switching circuit, and coupling N tap/taps of the allocation FIR filter to the second designated FIR filter through controlling the switching circuit, where M and N are integers equal to or greater than zero.

14. The device as claimed in claim 13, wherein the sum of said M and said N is equal to the third fixed number.

15. The device as claimed in claim 13, wherein the sum of said M and the first fixed number is different from the sum of said N and the second fixed number.

16. The device as claimed in claim 13, wherein the control circuit progressively increases or decreases a number of the taps of the allocation FIR filter coupled to the first designated FIR filter through controlling the switching circuit, and thereby the estimation circuit estimates the effect of filtering the first signal according to the one or more parameters as the coupling relation between the allocation FIR circuit and the first designated FIR filter varies, and accordingly generates part or all of the one or more estimation results.

17. The device as claimed in claim 16, wherein the control circuit progressively increases or decreases a number of the taps of the allocation FIR filter coupled to the second designated FIR filter through controlling the switching circuit, and thereby the estimation circuit estimates the effect of filtering the second signal according to the one or more parameters as the coupling relation between the allocation FIR circuit and the second designated FIR filter varies, and accordingly generates part or all of the one or more estimation results.

18. The device as claimed in claim 13, wherein the one or more parameters is one or a combination of a signal-to-noise ratio, at least one coefficient of the first designated FIR filter, at least one coefficient of the second designated FIR filter and a bit error rate.

19. The device as claimed in claim 13, wherein the allocation FIR filter is disposed in the first transceiver, the second transceiver, or both of the first and the second transceivers, or is disposed outside the first and the second transceivers.

20. An Ethernet communication device having a function of allocating finite impulse response (FIR) filtering resources, the device comprising:

a first transceiver including:

a first designated FIR filter being adapted to filter a first signal; and a first allocation FIR filter having a first fixed number of taps;

a second transceiver including:

a second designated FIR filter being adapted to filter a second signal different from the first signal; and a second allocation FIR filter having a second fixed number of taps;

a switching circuit being coupled to the first and the second allocation FIR filters, respectively;

an estimation circuit for estimating effects of filtering the first and the second signals according to one or more parameters related to a number of taps, so as to generate one or more estimation results; and a control circuit, in response to the one or more estimation results, for coupling M tap/taps of the total taps of the first and second allocation FIR filters to the first designated FIR filter through controlling the switching circuit, and coupling N tap/taps of the total taps of the first and second allocation FIR filters to the second designated FIR filter through controlling the switching circuit, where M and N are integers equal to or greater than zero.

21. The device as claimed in claim 20, wherein the sum of M and N equals to the sum of the first fixed number and the second fixed number.

22. The device as claimed in claim 20, wherein the one or more parameters is one or a combination of a signal-to-noise ratio, at least one coefficient of the first designated FIR filter, at least one coefficient of the second designated FIR filter and a bit error rate.

* * * * *